United States Patent
Goruganthu et al.

(12)
(10) Patent No.: US 6,635,572 B1
(45) Date of Patent: Oct. 21, 2003

(54) METHOD OF SUBSTRATE SILICON REMOVAL FOR INTEGRATED CIRCUIT DEVICES

(75) Inventors: Rama R. Goruganthu, Austin, TX (US); Richard W. Johnson, Cedar Creek, TX (US); Rosalinda M. Ring, Leominster, MA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/997,715

(22) Filed: Nov. 28, 2001

(51) Int. Cl.[7] .................. H01L 21/302; H01L 21/461
(52) U.S. Cl. .................. 438/689; 438/17; 438/723; 438/745; 438/756
(58) Field of Search .................. 257/621, 678, 257/686, 707, 738, 753, 778, 787–793; 438/17, 25, 26, 40, 106, 108, 112, 118, 124–127, 689, 690, 691, 706, 715, 723, 745, 756

(56) References Cited

U.S. PATENT DOCUMENTS 6,400,008 B1 * 6/2002 Farnworth .................. 257/698
6,414,585 B1 * 7/2002 Marcoux et al. ............ 338/309
6,422,919 B2 * 7/2002 Hembree .................... 451/28

OTHER PUBLICATIONS

V. Temesvary, S. Wu, W. H. Hsieh, Y. C. Tai, and D. K. Mui, "Design, Fabrication, and Testing of Silicon Microgimbals for Super–Compact Rigid Disk Drives," Journal of MEMS, vol. 4, No. 1, pp. 18–27, Mar. 1995.

* cited by examiner

Primary Examiner—Kamand Cuneo
Assistant Examiner—Asok Kumar Sarkar

(57) ABSTRACT

An integrated circuit die coupled to a package substrate and having circuitry in a circuit side opposite a back side is etched in a manner that inhibits the erosion of underfill material that is used around the periphery of the die and between the die and the package substrate. According to an example embodiment of the present invention, a protective coating adapted to resist etch chemicals is formed over the underfill material. The die is then etched using an etch chemistry that, absent the protective coating, would erode the underfill material. In this manner, etch chemistries that would harm the die, or even be unusable can be used to etch the die. In addition, problems associated with the underfill being eroded, such as die chipping, can be avoided.

20 Claims, 3 Drawing Sheets

METHOD OF SUBSTRATE SILICON REMOVAL FOR INTEGRATED CIRCUIT DEVICES

FIELD OF THE INVENTION

The present invention relates generally to semiconductor devices and their fabrication, and more particularly, to techniques for analyzing circuitry within an integrated circuit die attached to a package substrate.

BACKGROUND OF THE INVENTION

The semiconductor industry has recently experienced technological advances that have permitted dramatic increases in circuit density and complexity, and equally dramatic decreases in power consumption and package sizes. Present semiconductor technology now permits single-chip microprocessors with many millions of transistors operating at speeds of hundreds of millions of instructions per second to be packaged in relatively small, air-cooled semiconductor device packages.

As the manufacturing processes for semiconductor devices and integrated circuit (IC) dies increase in difficulty, methods for testing and debugging these devices become increasingly important. Not only is it important to ensure that individual chips are functional, it is also important to ensure that batches of chips perform consistently. In addition, the ability to detect a defective manufacturing process early is helpful for reducing the number of defective devices manufactured.

To increase the number of pad sites available for a die, to reduce the electrical path to the pad sites, and to address other problems, various chip packaging techniques have been developed. One of these techniques is referred to as controlled collapse chip connection or flip chip packaging. In flip chip packaged dies, transistors and other circuitry are generally formed in a very thin layer at a circuit side or front side of the die. The die is flipped so that the circuit side is positioned very near the package, and an opposing back side of the die remains exposed. Electrical connection from the die to the package is made between the flipped circuit side and the package, and an underfill region is formed between the die and the package. The underfill protects the circuit connections between the die and the package, and helps to hold the packaged die together.

The positioning of the circuit side near the package provides many advantages. However, in some instances, orienting the die with the circuit side face down on a substrate is disadvantageous. Due to this orientation of the die, the transistors and circuitry near the circuit side are not directly accessible for testing, modification or other purposes. Therefore, access to the transistors and circuitry near the circuit side is from the back side of the chip.

In many applications, accessing the circuitry includes etching a portion of the backside of the die. However, such etching can erode the underfill. When the underfill is eroded, the die is more susceptible to chipping, and the circuitry between the die and the package can be exposed. This can result in damage to the die, which can cause problems, for example, during analysis of the die.

One particular type of integrated circuit die includes silicon on insulator (SOI) structure. SOI structure includes a buried insulator, such as oxide, and circuitry formed on the insulator. In flip chip and other applications, the circuitry is often accessed through the insulator portion of the SOI structure, where substrate over the insulator has to be removed in order to expose the insulator. In some applications, the die is etched to expose the insulator using an etch chemistry, such as an etch chemistry including TMAH, that erodes the underfill.

SUMMARY OF THE INVENTION

The present invention is directed to approaches for addressing challenges discussed above, including challenges to etching IC dies, as exemplified in a number of implementations and applications, some example aspects of which are summarized below.

According to an example embodiment of the present invention, an IC die coupled to a package substrate is etched in a manner that inhibits the erosion of an underfill portion adjacent to the package and around the die periphery. A protective coating that is adapted to inhibit underfill erosion by etch chemicals is formed over some or all of the underfill. After the protective coating is formed, the die is etched while using the protective coating to inhibit erosion of the underfill. In this manner, problems related to erosion of the underfill, damage to the die and those discussed above are reduced or even eliminated.

According to a more particular example embodiment of the present invention, a flip chip packaged die having silicon on insulator (SOI) structure is etched and analyzed in a manner that inhibits erosion of an underfill portion of the packaged die structure. The flip chip die has a circuit side and a back side, the circuit side faces the package substrate and the underfill portion is between the die and the package and around a periphery of the circuit side of the die. A portion of the back side of the die is removed and a portion of the die is exposed. A protective coating adapted to inhibit erosion of the underfill in the presence of TMAH is formed covering the underfill and a portion of the exposed portion of the die. After the protective coating is formed, the die is etched using a TMAH solution while using the protective coating to inhibit erosion of the underfill, and a portion of the insulator of the SOI structure is exposed. The die is then analyzed via the exposed insulator portion.

In another example embodiment of the present invention, a system is adapted for etching an IC die coupled to a package substrate and having an underfill portion adjacent to the package and around the die periphery. The system includes a deposition arrangement adapted to form a protective coating over the underfill that inhibits erosion of the underfill during etching. An etching arrangement is adapted to etch a portion of the IC die, after forming the protective coating, while using the protective coating to inhibit erosion of the underfill.

The above summary is not intended to describe each illustrated embodiment or every implementation. The figures and detailed description that follow more particularly exemplify these embodiments.

BRIEF DESCRIPTION OF THE DRAWINGS

The present invention may be more completely understood in consideration of the following detailed description of various embodiments in connection with the accompanying drawings, in which.

The above summary is not intended to describe each illustrated embodiment or every implementation. The figures and detailed description that follow more particularly exemplify these embodiments.

DETAILED DESCRIPTION

The present invention is believed to be applicable to a variety of different types of semiconductor devices, and has been found particularly suited to packaged devices having underfill that is susceptible to erosion during etching. While not necessarily limited to such devices, various aspects may be appreciated through a discussion of examples using this context.

According to an example embodiment of the present invention, a protective material that is resistant to etch chemicals is used to cover some or all of an underfill material used in a packaged integrated circuit die. The protective material is selected to be resistive to etch chemicals used in a particular etch process for etching the die, such as a wet etch process or a dry etch process. After the protective material is formed on the underfill, the die is etched while using the protective material to inhibit the etch chemicals from eroding the underfill material. By inhibiting underfill erosion, problems such as die chipping that can result from loss of underfill material are reduced.

Figure 1:
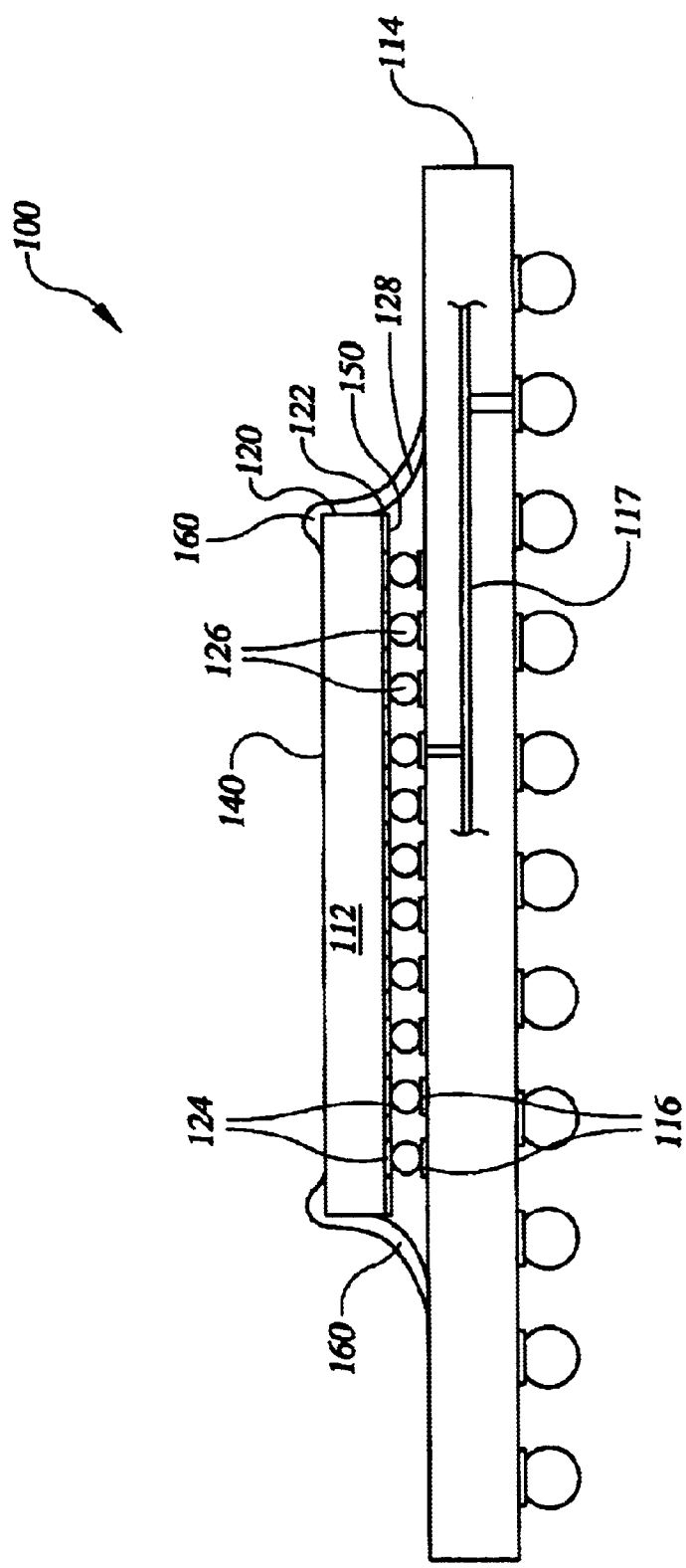
FIG. 1 is an integrated circuit die having a protective layer over an underfill region, according to an example embodiment of the present invention.

The present invention is applicable to a variety of types of integrated circuit dies and etch processes. FIG. 1 shows one such die 112 arranged in a flip chip arrangement, according to a more particular example embodiment of the present invention. The die 112 has circuitry in a thin epitaxial layer 122 that is opposite a back side substrate 120, and is flipped such that a surface 150 of the circuit side faces a package substrate 114, and a surface 140 of the back side is exposed. Circuitry in the die is coupled to the package substrate 114 via pads 124 on the die, solder bumps 126 and pads 116 on the package substrate. The pads 116 are coupled to interconnects, such as interconnect 117, in the package substrate for coupling to other circuitry. An underfill material 128 is between the die and package and around the periphery of the die.

A protective coating 160 is formed on the underfill material 128, around the periphery of the die 112 and over a portion of the back side surface 120. The protective coating includes material that is resistive to etch chemicals to be introduced to the die. The die is then etched to remove a portion of the back side substrate 120, using the protective coating to inhibit the erosion of the underfill material by chemicals used in the etch process.

In another example embodiment of the present invention, the protective coating is formed as part of the underfill material. During assembly of the die to the package, the underfill material used is resistive to chemicals to be used during subsequent etching, such as for analysis or other processes. In this manner, the protective layer is already part of the underfill and does not have to be subsequently formed.

The protective material can include one or more of a variety of materials. In one implementation, the protective coating 160 includes cyanoacrylate. The cyanoacrylate can be used to inhibit erosion in a variety of applications, such as during a wet chemical etch process that uses tetramethyl ammonium hydroxide (TMAH) of between about 15–25% by weight in water. Cyanoacrylate material that can be used in connection with the present invention may, for example, include one or more commercially available cyanoacrylate materials, such as those available from Loctite Corporation of Louisville, Ky.

Figure 2:
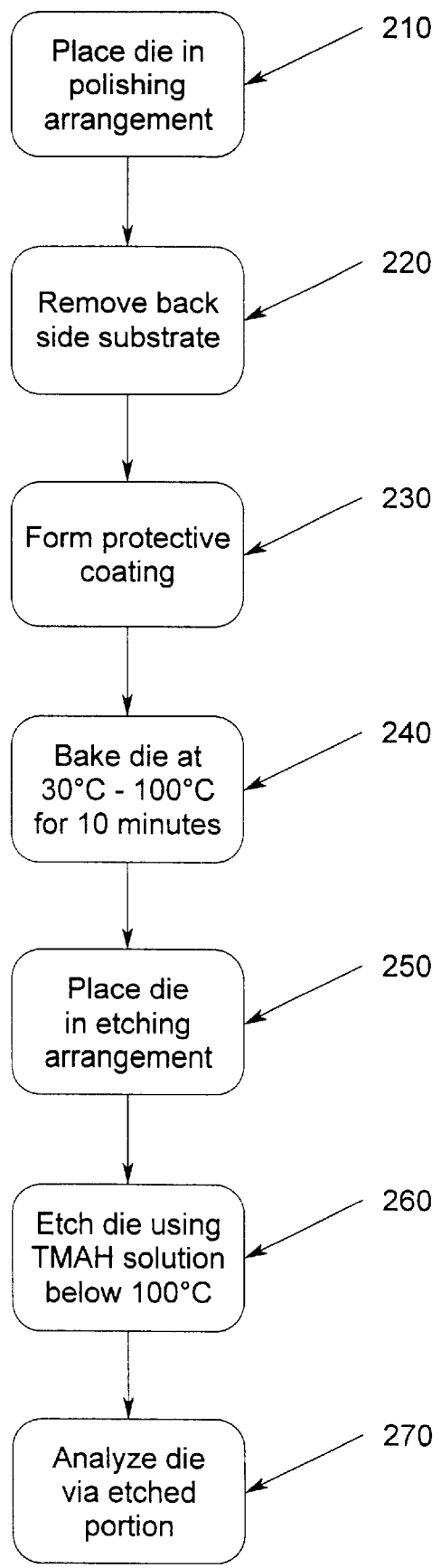
FIG. 2 is a flow diagram for etching an integrated circuit die, according to another example embodiment of the present invention.

FIG. 2 is a flow diagram of a method for etching a flip chip packaged integrated circuit die, such as the die shown in FIG. 1, according to another example embodiment of the present invention. At block 310, the packaged die is placed in a polishing arrangement, such as a chemical-mechanical polishing arrangement. At block 220, substrate is polished, or removed, from the back side of the die. A protective coating is formed on an underfill material between the die and package at block 230. After the underfill material is formed, the packaged die is baked in an oven at temperature of between about 30 and 100 degrees Celsius at block 240. The die is placed in an etching arrangement at block 250, and a chemical etching solution including TMAH that is below a temperature of about 100 degrees Celsius is used to etch the die at block 260. The etching exposes a portion of the die, and the die is analyzed via the exposed portion of the die at block 270.

In a more particular example embodiment of the present invention, the die being analyzed includes silicon on insulator (SOI) structure, where an insulator layer (e.g., oxide) is formed between the back side and circuitry in the circuit side, and the circuitry can be accessed through the insulator portion. Once the SOI die is packaged, the back side is face-up and over the insulator portion. At block 220, the back side of the die is thinned to between about 40 and 100 microns, and the TMAH etch at block 260 is used to etch the back side and to expose the insulator. The die can then be analyzed via the exposed insulator at block 270.

Figure 3:
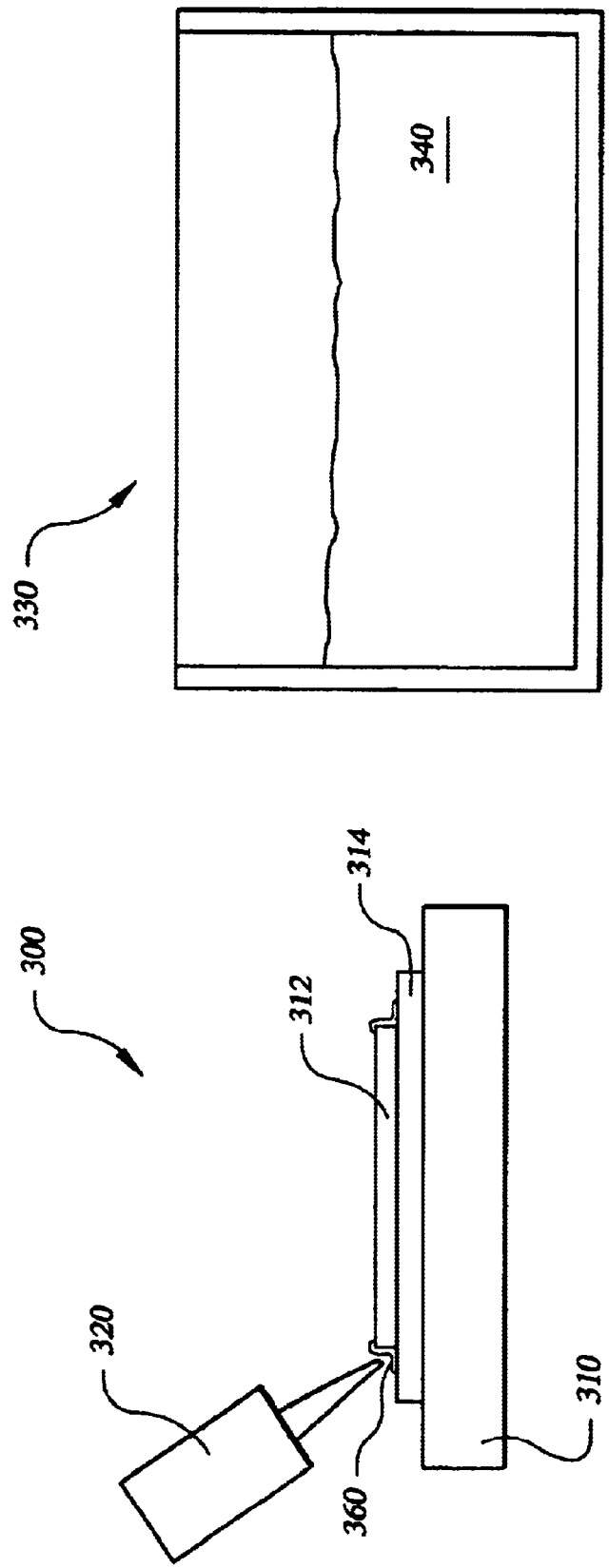
FIG. 3 is a system adapted for etching an integrated circuit die, according to another example embodiment of the present invention.

FIG. 3 shows a system 300 for etching a packaged integrated circuit die 312 coupled to a package substrate 314, according to another example embodiment of the present invention. The die 312 may include, for example, a packaged die such as the one shown in FIG. 1. The packaged die is located on a stage 310, and a deposition arrangement 320 is adapted to deposit a protective material 360, such as a cyanoacrylate material, around the die periphery and on underfill material between the die and package in a manner that inhibits erosion of the underfill material. The deposition arrangement may, for example, be coupled to a mechanical and/or robotic arm (not shown) adapted to position the arrangement for depositing the protective material. In one implementation, the arm is controlled by a controller programmed to move the arm around a particular die using coordinates that represent the periphery of the die. The system 300 further includes an etching arrangement 330 adapted to hold wet etch chemicals 340, such as a TMAH solution, and the packaged die 312. The deposited protective material inhibits the erosion of the underfill material while the die is in the wet chemical solution 340.

While the present invention has been described with reference to several particular example embodiments, those skilled in the art will recognize that many changes may be made thereto without departing from the spirit and scope of the present invention, which is set forth in the following claims.

What is claimed is:

1. A method for etching an IC die coupled to a package substrate and having an underfill material adjacent to the package and to the periphery of the die, the method comprising:

forming a protective coating over the underfill material, the protective coating being adapted to inhibit erosion of the underfill by chemicals used in an etch process; and after forming the protective coating, using the protective coating to inhibit erosion of the underfill while etching a portion of the die.

2. The method of claim 1, wherein forming a protective coating includes forming a protective coating on at least a portion of the die periphery.

3. The method of claim 1, wherein forming a protective coating includes forming a protective coating on at least a portion of an upper surface of the die that is opposite a surface of the die that faces the package substrate.

4. The method of claim 1, wherein forming a protective coating includes forming a protective coating on all exposed portions of the underfill.

5. The method of claim 1, wherein the die is a flip-chip die having circuitry in a circuit side opposite a back side, the circuit side being coupled to and facing the package substrate, wherein etching a portion of the IC die includes etching a portion of the back side of the die.

6. The method of claim 1, wherein the die includes silicon on insulator (SOI) structure and wherein etching a portion of the die includes etching a portion of substrate over an insulator portion of the SOI structure.

7. The method of claim 6, wherein etching the die includes exposing the insulator portion.

8. The method of claim 1, further comprising removing a portion of substrate from the die, prior to forming the protective coating.

9. The method of claim 8, wherein removing a portion of substrate includes exposing a portion of the die and wherein forming the protective coating includes forming a protective coating on the exposed portion.

10. The method of claim 1, wherein etching a portion of the die includes using TMAH and wherein forming a protective coating includes forming a protective coating adapted to resist etching by the TMAH.

11. The method of claim 1, wherein forming a protective coating includes forming a polymer.

12. The method of claim 1, wherein forming a protective coating includes forming a protective coating that includes cyanoacrylate.

13. The method of claim 1, wherein forming a protective coating includes forming a protective coating that is adapted to inhibit chipping of the die.

14. The method of claim 13, wherein forming a protective coating includes forming the coating over a portion of the die and inhibiting chipping the die.

15. The method of claim 1, wherein etching a portion of the die includes etching at a temperature below 100 degrees Celsius.

16. The method of claim 1, further comprising baking the packaged die in an oven at a temperature of between about 30 and 150 degrees Celsius, prior to etching a portion of the die.

17. The method of claim 16, wherein baking the packaged die in an oven includes baking the die for about 10 minutes.

18. The method of claim 1, further comprising analyzing the die via a portion of the die exposed during the etching.

19. The method of claim 1, wherein forming the protective coating includes forming the underfill of the die, wherein the underfill includes the protective coating.

20. A method for analyzing a flip chip packaged die having silicon on insulator (SOI) structure and having an underfill material around the die periphery, the die having a circuit side and a back side, the circuit side facing and coupled to the package substrate, the method comprising:

removing a portion of the back side of the die and exposing a portion of the die;

forming a protective coating that covers the underfill and a portion of the exposed portion of the die, the protective coating being adapted to inhibit erosion of the underfill in the presence of TMAH;

after forming the protective coating, using the protective coating to inhibit erosion of the underfill while etching a portion of the die with a TMAH solution and exposing a portion of the insulator of the SOI structure; and analyzing the die via the exposed insulator portion.

\* \* \* \* \*